US010229839B2

(12) United States Patent
Anderson et al.

(10) Patent No.: US 10,229,839 B2
(45) Date of Patent: Mar. 12, 2019

(54) TRANSITION METAL-BEARING CAPPING FILM FOR GROUP III-NITRIDE DEVICES

(71) Applicant: The United States of America, as Represented by the Secretary of the Navy, Washington, DC (US)

(72) Inventors: Travis J. Anderson, Alexandria, VA (US); Boris N. Feygelson, Springfield, VA (US); Andrew D. Koehler, Alexandria, VA (US); Karl D. Hobart, Alexandria, VA (US); Francis J. Kub, Arnold, MD (US); Jordan Greenlee, Vienna, VA (US)

(73) Assignee: The United States of America, as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/582,785

(22) Filed: May 1, 2017

(65) Prior Publication Data
US 2017/0316952 A1    Nov. 2, 2017

Related U.S. Application Data

(60) Provisional application No. 62/329,423, filed on Apr. 29, 2016.

(51) Int. Cl.
| *H01L 21/02* | (2006.01) |
| *H01L 29/20* | (2006.01) |
| *H01L 21/265* | (2006.01) |
| *H01L 21/324* | (2006.01) |

(52) U.S. Cl.
CPC ...... *H01L 21/3245* (2013.01); *H01L 21/0254* (2013.01); *H01L 29/2003* (2013.01); *H01L 21/2654* (2013.01)

(58) Field of Classification Search
None
See application file for complete search history.

(56) References Cited

U.S. PATENT DOCUMENTS

| 7,419,892 B2 | 9/2008 | Sheppard et al. | |
| 7,977,224 B2* | 7/2011 | Hager, IV | H01L 21/324 257/E21.12 |
| 8,518,808 B2* | 8/2013 | Feigelson | H01L 21/324 257/E21.077 |
| 9,543,168 B2 | 1/2017 | Feigelson et al. | |

(Continued)

OTHER PUBLICATIONS

Greenlee et al. "Comparison of AlN Encapsulants for Bulk GaN Multicycle Rapid Thermal Annealing", Sep. 9, 2015, ECS Jounal, 4, pp. 403-407.*

(Continued)

*Primary Examiner* — Telly D Green
(74) *Attorney, Agent, or Firm* — US Naval Research Laboratory; Joseph T. Grunkemeyer

(57) ABSTRACT

An method of annealing by: providing a substrate having a III-nitride, sapphire, silicon, diamond, gallium arsenide, or silicon carbide surface; depositing a layer of a transition metal nitride directly on the surface; and annealing the substrate at at least 900° C. in an oxygen-free environment. An article having: a substrate having a III-nitride, sapphire, silicon, diamond, gallium arsenide, or silicon carbide surface; and a layer of a transition metal nitride directly on the surface.

24 Claims, 7 Drawing Sheets

(56) References Cited

U.S. PATENT DOCUMENTS

| | | | |
|---|---|---|---|
| 2002/0121703 A1* | 9/2002 | Toyoda | H01L 21/76834 257/762 |
| 2009/0108294 A1* | 4/2009 | Choi | H01L 21/28088 257/190 |
| 2010/0133656 A1* | 6/2010 | Hager, IV | H01L 21/324 257/615 |
| 2010/0200950 A1* | 8/2010 | Kim | H01L 21/02189 257/532 |
| 2015/0279737 A1* | 10/2015 | Lee | H01L 21/76889 257/757 |
| 2017/0018346 A1* | 1/2017 | Natali | H01F 10/18 |
| 2017/0022632 A1* | 1/2017 | Natali | C30B 29/38 |

OTHER PUBLICATIONS

Nogales et al., "Failure mechanism of AlN nanocaps used to protect rare earth-implanted GaN during high temperature annealing" Appl. Phys. Lett. 88, 031902 (2006).

Greenlee et al., "NbN Capping Layer for Enhanced Thermal Processing of Group III-Nitride Semiconductor Devices" ECS Journal of Solid State Science and Technology, 6 (2) Q3067-Q3070 (2017).

* cited by examiner

Sample A: Conventional Anneal
Conventional anneal –
900 °C for 30 minutes

TRANSITION METAL-BEARING CAPPING FILM FOR GROUP III-NITRIDE DEVICES

This application claims the benefit of U.S. Provisional Application No. 62/329,423, filed on Apr. 29, 2016. The provisional application and all other publications and patent documents referred to throughout this nonprovisional application are incorporated herein by reference.

TECHNICAL FIELD

The present disclosure is generally related to protective capping films.

DESCRIPTION OF RELATED ART

Group III-nitride materials, such as GaN, AlN, InN and their alloys are promising materials for power, RF, and optoelectronic applications due to their advantageous properties. These properties include radiation hardness, a direct bandgap ranging from 0.7 eV to 6.1 eV, and a favorable Baliga figure of merit compared to Si and SiC (Jain et al., *J. Appl. Phys.*, 87, 965 (2000); Anderson et al., *IEEE Electron Device Lett.*, 35, 826 (2014)). The majority of power electronic devices are still implemented commercially today in Si and SiC, partially because the ability to selectively dope the III-nitride material system is not as well understood as it is for other commercial materials (Ronning et al., *Phys. Rep.*, 351, 349 (2001)).

The III-nitride alloys have many favorable properties, making them suitable for a broad range of technological applications. For example, the III-nitride family of alloys has a tunable direct bandgap between 0.7 and 6.1 eV, corresponding to InN and AlN respectively, which is useful in optoelectronic applications. The wide bandgap and high mobilities achievable in this family of materials make III-nitrides suitable for power electronic applications.

Although the III-nitride alloys have many favorable properties, challenges remain in processing these materials. One of these processing challenges is the ability to anneal Ga, Al, and In-bearing compounds at elevated temperatures. The ability to anneal at elevated temperatures is a necessary step for planar processing, including selective area doping and has been shown to improve HEMT device performance (Yu et al., *IEEE Electron Device Lett.*, 26, 283 (2005); Nanjo et al., *Appl. Phys. Express*, 2, 31003 (2009)). In selective area doping, ions are implanted into the semiconductor and subsequently activated via a post-implantation anneal. The ability to process III-nitride materials in a planar fashion will enhance several devices such as vertical structures with implanted guard rings, implanted contact regions to lower contact resistance, and for vertical transistors.

Furthermore, annealing at elevated temperatures can be used to improve the crystalline quality of implanted or unimplanted III-nitride material (Thaler et al., *J. Cryst. Growth*, 312, 1817 (2010)). For example, the defect density in unimplanted AlN decreases when annealed at temperatures up to 1400° C. (Fan et al., *Appl. Phys. Lett.*, 76, 1839 (2000); Greenlee et al., *Electron. Mater. Lett.*, 12, 133 (2016)). It is likely that further improvements in crystal quality will be realized with higher annealing temperatures, but the decomposition of AlN poses a problem (Fan).

In fact, it is extremely difficult to anneal III-nitride semiconductors such as GaN and its alloys with InN and AlN (Thaler). Elevated temperature annealing is required for repairing implantation-induced damage and activating impurities such as magnesium (Mg) after implantation. Temperatures above 1300° C. are required to activate implanted Mg. GaN is stable at atmospheric pressures up to around 850° C. (Unland et al., *J. Cryst. Growth*, 256, 33 (2003)). At temperatures above this, GaN decomposes into Ga and $N_2$. In-bearing alloys have even lower decomposition temperatures at atmospheric pressures (Thaler; Watanabe et al., *J. Appl. Phys.*, 118, 235705 (2015)). There are a few approaches to solve the problem of GaN decomposition during high temperature annealing. First, III-nitrides can be annealed at high temperatures without decomposing with the use of a high nitrogen overpressure. For example, to anneal GaN at temperatures above 1300° C., a nitrogen overpressure greater than 1.0 GPa is required (Kuball et al., *J. Appl. Phys.*, 87, 2736 (2000)). Unfortunately, these high pressures require specialized equipment that makes this approach unsuitable for industrial scaling.

An alternative method for annealing III-nitrides at temperatures above their thermodynamically stabile temperatures is by the use of a capping layer. One of the requirements for this cap is that it is composed of a thermally stable material. Previously, AlN capping layers have been implemented to prevent the decomposition of GaN at high temperatures (Zolper et al., *Appl. Phys. Lett.*, 69, 538 (1996)). AlN capping layers have been deposited by sputtering or by MOCVD growth on the surface of GaN (Feigelson et al., *J. Cryst. Growth*, 350, 21 (2012)). The cap suppresses the escape of nitrogen from GaN before the nitrogen pressure can build up to levels that would result in a rupture of the capping layer. The use of an AlN cap enables the annealing of GaN at temperatures above without surface damage.

The removal of the capping material presents a significant challenge, especially in the case of AlN. One method of removing the capping layer from the surface of III-nitride materials is a dry etch plasma-based process. Unfortunately, plasma-based etching of III-nitride materials leads to severe crystalline damage at the surface (Cao et al., *IEEE Trans. Electron Devices*, 47, 1320 (2000)). For example, the surface of p-type GaN has been shown to convert to n-type due to all of the donors created during plasma processing. Thus, plasma processing is not a viable option for the removal of the capping material A second method for etching the capping material includes wet chemical etching. AlN caps have been shown to reliably protect the underlying GaN during high temperature annealing. Unfortunately, AlN is very resilient to wet etching and requires the use of chemical etchants that are harmful to many III-nitride materials. The solution that is commonly used to remove AlN capping layers is KOH-bearing (Greenlee et al., *Appl. Phys. Express*, 8, 36501 (2015)). KOH has been shown to etch Al and In-bearing III-nitride semiconductors as well as nitrogen polar GaN (Ohata et al., *Jpn. J. Appl. Phys.*, 52, 08JB11 (2013)). Therefore, an AlN capping layer cannot be used to protect Al or In containing III-nitride alloys or N-polar GaN. Furthermore, in the processing of bulk GaN wafers, if the nitrogen-polar surface must be preserved, KOH cannot be used. If a device is to be formed using In or Al-bearing materials, a method of preventing GaN decomposition and nitrogen escape during high temperature annealing with a capping layer that does not require a KOH-based wet etchant is needed.

BRIEF SUMMARY

Disclosed herein is a method comprising: providing a substrate having a surface comprising a III-nitride, sapphire, silicon, diamond, gallium arsenide, or silicon carbide;

depositing a layer of a transition metal nitride directly on the surface; and annealing the substrate at at least 900° C. in an oxygen-free environment.

Also disclosed herein is an article comprising: a substrate having a surface comprising a III-nitride, sapphire, silicon, diamond, gallium arsenide, or silicon carbide; and a layer of a transition metal nitride directly on the surface.

BRIEF DESCRIPTION OF THE DRAWINGS

A more complete appreciation will be readily obtained by reference to the following Description of the Example Embodiments and the accompanying drawings.

DETAILED DESCRIPTION OF EXAMPLE EMBODIMENTS

In the following description, for purposes of explanation and not limitation, specific details are set forth in order to provide a thorough understanding of the present disclosure. However, it will be apparent to one skilled in the art that the present subject matter may be practiced in other embodiments that depart from these specific details. In other instances, detailed descriptions of well-known methods and devices are omitted so as to not obscure the present disclosure with unnecessary detail.

Disclosed is a capping structure and fabrication sequence for III-nitride semiconductors that can be used to reduce defects and activate impurities. III-nitride materials, such as GaN, AlN, InN and their alloys are promising materials for power, RF, and optoelectronic applications due to their advantageous properties. These properties include radiation hardness, a direct bandgap ranging from 0.7 eV to 6.1 eV, and a favorable Baliga figure of merit compared to Si and SiC. Most power devices are still implemented commercially today in Si and SiC, partially because the ability to selectively dope the III-nitride material system is not as well understood as it is for other commercial materials.

The method provides an enabling processing step for annealing III-nitride materials. Annealing is commonly used in semiconductor processing for defect removal and impurity activation. However, the temperatures that can be applied during an annealing process to many materials in the III-nitride and other material systems are limited by the decomposition temperature of the material. A capping layer, described herein, can be used to protect the material during high temperature annealing and thus extend the range of material stability. Previously, AlN has shown the most promise for III-nitride capping layers. Unfortunately, AlN is very resilient to wet etching and requires harsh chemical, largely KOH-based, or plasma etching for removal. Herein, capping materials are demonstrated that facilitate high temperature annealing while protecting the underlying semiconductor.

More specifically the method involves the capping of semiconductors with a layer that can be rapidly removed using standard semiconductor etchants that will not attack the underlying III-nitride material. The method is applicable to InGaN, GaN, AlGaN, InN, AlN, InAlN, InAlGaN, and all of their alloys.

To overcome the inability to etch AlN capping layers without damaging the underlying III-nitride material, a new capping layer consisting of transition metal-nitride materials, such as NbN, may be used. These capping materials and devices produced from them make it possible, for example, to realize p-type conductivity in $In_xGa_{(1-x)}N$ and $Al_xGa_{(1-x)}N$ by ion implantation. The cap may be deposited by any thin film deposition technique, for example, by atomic layer deposition (ALD), metal organic chemical vapor deposition (MOCVD), molecular beam epitaxy (MBE), or physical vapor deposition (PVD).

Figure 1:
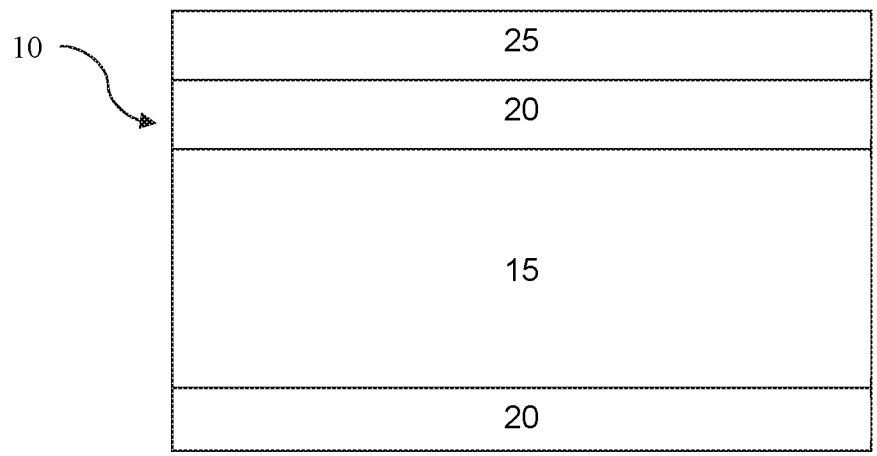
FIG. 1 shows a cross-sectional schematic of a transition metal-nitride capped bulk III-nitride semiconductor.
Figure 2:
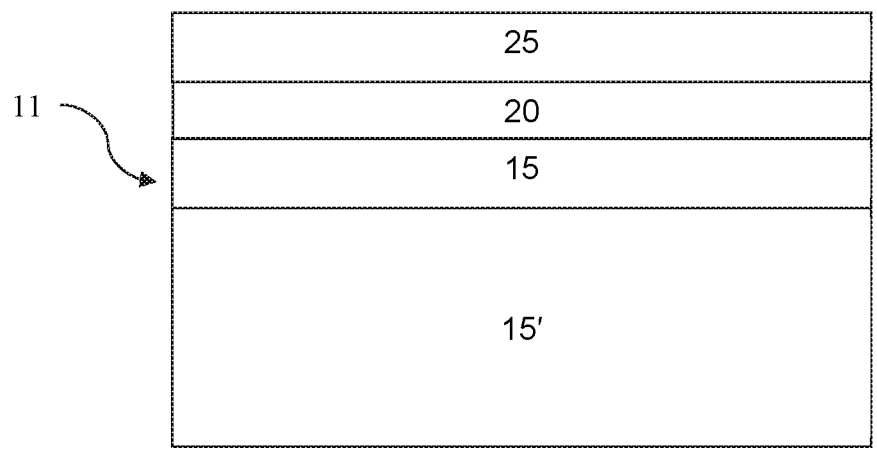
FIG. 2 shows a cross-sectional schematic of a transition metal-nitride capped III-nitride thin film.

In the first step of the method, a substrate is provided having a surface comprising a III-nitride, sapphire, silicon, diamond, gallium arsenide or silicon carbide. As shown in FIG. 1, the device 10 may have a bulk substrate 15, such as a bulk III-nitride substrate or a bulk GaN substrate. Alternatively, as shown in FIG. 2, the device 11 may have a substrate 15' of another material (including a III-nitride) with a surface or epitaxial layer 15 of the III-nitride to be annealed. The surface may also include more than one of these materials, such as a patterned surface.

The substrate or its surface may comprise any of GaN, AlN, InN, InGaN, AlGaN, InAlN, InAlGaN, or any alloy or combination of these materials. The surface may also comprise an impurity or implanted ion such as Mg. Also, the surface may exhibit p-type conductivity, which is retained after performing the method. The surface may be of any crystal polarity found in these materials.

In the second step, a layer of a transition metal nitride is deposited directly on the surface. Suitable methods for depositing include, but are not limited to, atomic layer deposition, metal organic chemical vapor deposition, molecular beam epitaxy, or physical vapor deposition. Suitable transition metal nitrides include, but are not limited to, NbN, TiN, TaN, ZrN, HfN, VN, and $V_2N$. Any combination of more than one transition metal nitride may be used, including mixtures, alloys or multiple discrete layers thereof.

As shown in FIG. 2, the surface 15 has a layer of capping material 20 thereon. As shown in FIG. 1, the substrate 15, may have a layer of capping material 20 on both sides of the substrate 15. Both sides of a non-bulk substrate may also have capping layers if both sides also have III-nitride, sapphire, silicon, diamond, gallium arsenide, or silicon carbide surfaces.

In an optional step, a 10-1000 nm thick layer 25 of AlN, SiN, or other stable high temperature material is deposited on the transition metal nitride 20. Methods for depositing AlN are disclosed in U.S. Pat. Nos. 8,518,808 and 9,543,168. This can provide extra protection during the annealing.

In the next step, the substrate with capping layer(s) is annealed in an oxygen-free environment at at least 900° C. Higher temperatures may be used, including at least 1200° C. or any temperature greater than the decomposition temperature of the surface (III-nitride, sapphire, silicon, diamond, gallium arsenide or silicon carbide) at atmospheric pressure. The temperature may be limited by the decomposition, melting, or otherwise transformative temperatures of other materials present in the device. The annealing may be according to methods disclosed in U.S. Pat. Nos. 8,518,808 and 9,543,168.

In an optional step, the capping layer is etched away with an etchant. The etchant may be any etchant for the capping layer that does not also etch the surface. Suitable etchants include HF, dilute HF, or $HF/NO_3$. An AlN layer on transition metal nitride layer would also be etched away, possibly by a method that would have damaged the III-nitride surface if the transition metal nitride layer were not protecting it.

NbN, is a high temperature material that is easily etched in $HF/HNO_3$. The thermal decomposition of NbN occurs at 2300° C. (Chernyaeva et al., *Sov. Powder Metall. Met. Ceram.*, 29, 387 (1990)). InGaN may be used as the underlying layer to be protected by NbN. InGaN is notoriously difficult to anneal due to its low decomposition temperature. InGaN has a variable decomposition temperature based on the amount of In in the alloy. For low In percentages in InGaN films, it has been shown that the thermal decomposition occurs between 660-700° C. (Averbeck et al., *Phys. Status Solidi A,* 176, 301 (1999).

Figure 3:
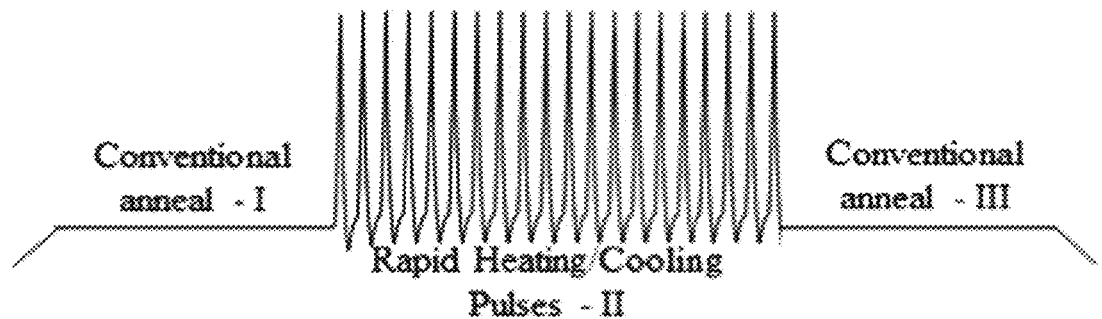
FIG. 3 shows the temperature profile of the annealing process utilized to demonstrate the efficacy of the transition metal-nitride cap. Sample A was annealed at 900° C. for 30 minutes while sample B was annealed using the symmetric multicycle rapid thermal annealing (SMRTA) process with a maximum annealing temperature of 1220° C. The conventional annealing steps in the SMRTA process were conducted at 900° C. for 30 minutes.

A NbN capping layer was grown by physical vapor depositing (sputtering) an NbN capping layer on a single layer of p-type $In_{0.03}Ga_{0.97}N$ grown by an Aixtron close-coupled showerhead (CCS) 6×2-inch metallorganic chemical vapor deposition (MOCVD) system. The Mg-doped p-InGaN layer was grown on a 2-μm-thick GaN template on a c-plane sapphire substrate and had a thickness of 350 nm and a free-hole concentration ~1018 $cm^{-3}$. The samples were annealed at 2 different temperatures ranging from 900 to 1220° C. as shown in FIG. 3. The first sample (A) was annealed at 900° C. for 30 minutes. Sample B was annealed using the symmetric multicycle rapid thermal annealing (SMRTA) process with conventional annealing performed at 900° C. for 30 minutes and rapid heating and cooling cycles (Greenlee et al., *ECS J. Solid State Sci. Technol.,* 4, 382 (2015)). The rapid heating and cooling cycles were performed with maximum annealing temperatures of 1220° C. for sample B. The samples were annealed in a pyrolytic boron nitride crucible with RF heating under a nitrogen overpressure of 24 bar. Each sample was capped with NbN on half of the sample using a shadow mask during the sputtering process. The sputtering process consisted of a pre-sputter step and a deposition step. Both steps were performed with the same conditions, but the pre-sputter was performed with a shutter covering the sample to prevent deposition while the target was being conditioned. The sputtering conditions include $Ar/N_2$ flows of 21/4 sccm at a pressure of 3 mT and a power of 100 W. The target NbN thickness was 250 nm. This thickness was chosen because AlN capping layers of this thickness have been used on GaN (Greenlee et al., *ECS J. Solid State Sci. Technol.,* 4, 403 (2015)).

Figure 4:
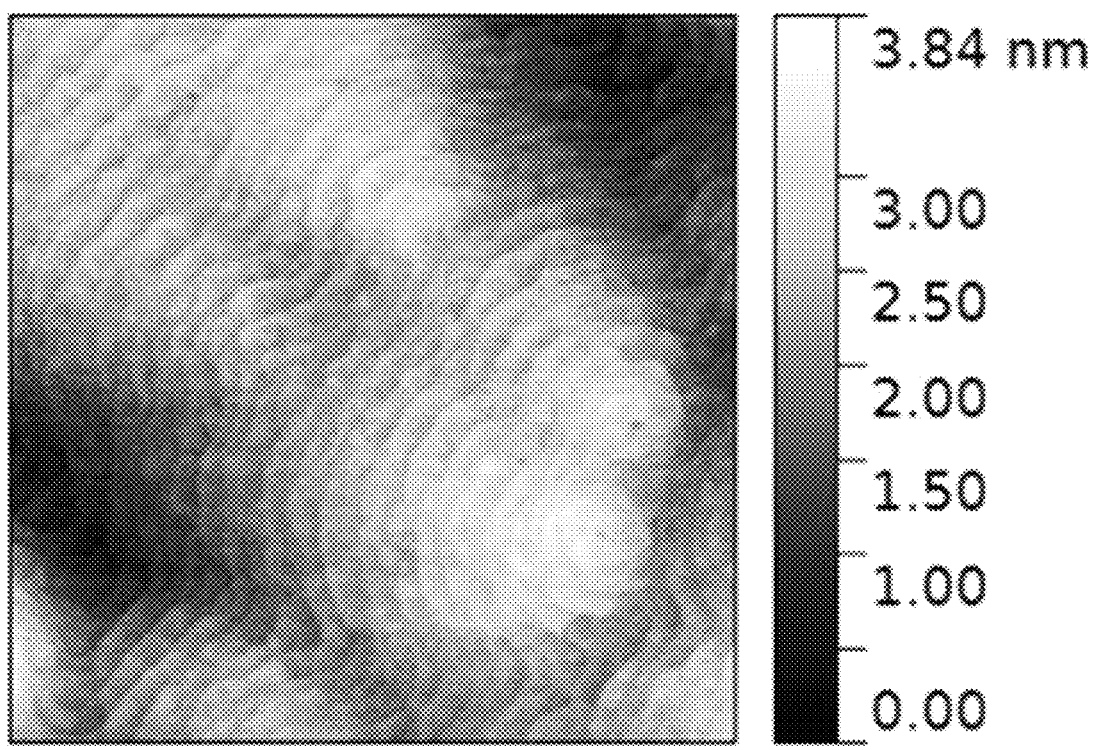
FIG. 4 shows AFM images of an as-grown sample. The surface of the as-grown InGaN is smooth with evidence of 3-dimensional and 2-dimensional epitaxial growth present with an RMS roughness of 0.39 nm.
Figure 5:
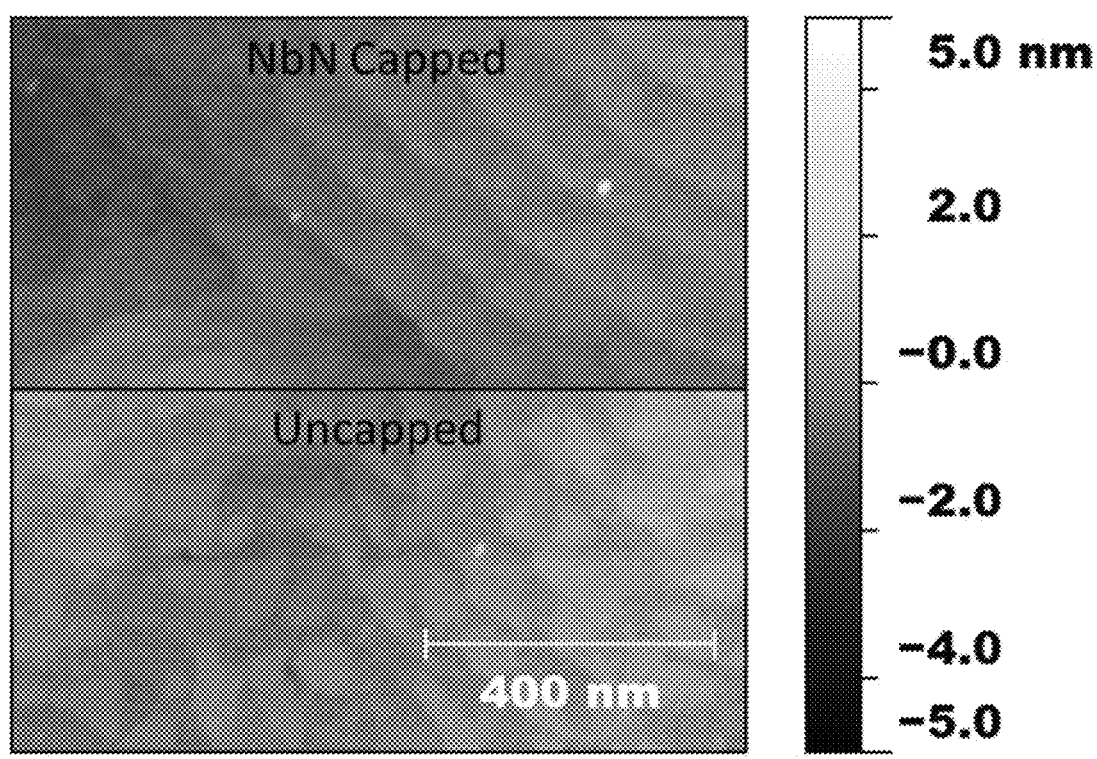
FIG. 5 shows AFM images of Sample A in the capped and uncapped regions after annealing. The capped portion of the sample has smooth growth steps while the growth steps of the uncapped portion begin to show surface structure due to decomposition of the InGaN.
Figure 6:
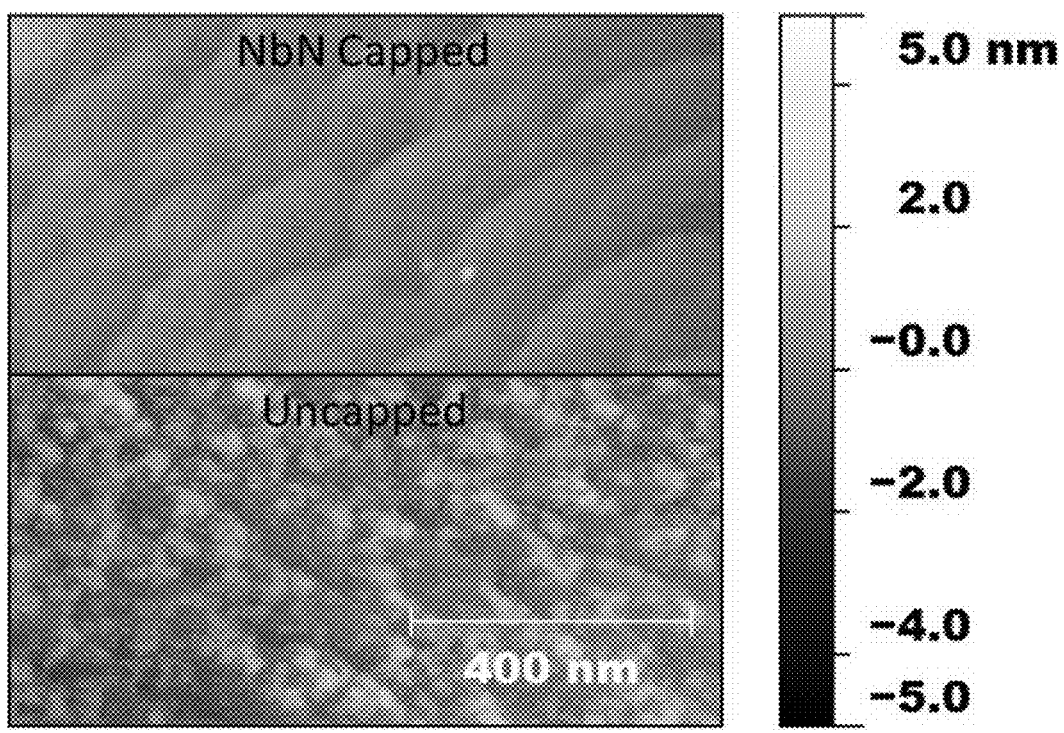
FIG. 6 shows AFM images of Sample B in the capped and uncapped regions after annealing. The capped portion of the sample has smooth growth steps while the growth steps of the uncapped portion are almost undiscernible due to decomposition of the InGaN.

The surface morphology and chemical composition were monitored by atomic force microscopy (AFM) and X-ray photoelectron spectroscopy (XPS), respectively. As grown, the surface of the InGaN is smooth with evidence of 3-dimensional and 2-dimensional epitaxial growth present as shown in FIG. 4 with an RMS roughness of 1.39 nm. After annealing at 900° C. for 30 minutes, the growth steps of the capped surface are unchanged and extremely smooth as shown in FIG. 5. The surface roughness of the capped surface annealed at 900° C. for 30 minutes is 0.42 nm RMS. The same growth steps are evident on the uncapped surface, but there is evidence of redeposition on the steps, suggesting that there was a small amount of decomposition of the InGaN during the annealing process at 900° C. The surface roughness for the uncapped portion of the sample annealed at 900° C. for 30 minutes is 0.54 nm RMS, consistent with slight decomposition on the surface of the unprotected InGaN during the 900° C. anneal. This decomposition is expected because the decomposition temperature for InGaN, even for low In concentrations, has been reported as below 700° C. (Averbeck et al., *Phys. Status Solidi A,* 176, 301 (1999)). After the 1220° C. anneal, the contrast is even greater between the surface morphology of the uncapped and capped portions of the samples. The capped surface after the 1220° C. anneal is still extremely smooth with a 0.35 nm RMS roughness. The growth steps are barely discernible on the surface of the uncapped portion of the sample, and there is clear evidence of annealing-induced dam-age and associated surface roughening. The RMS roughness is 0.63 nm, almost double that of the capped surface roughness. The surface roughness of the samples in the capped and uncapped portions of the samples is reported in Table 1.

TABLE 1

| Surface roughness | | |
|---|---|---|
| | Sample A RMS Roughness (nm) | Sample B RMS Roughness (nm) |
| As-grown | 0.39 | .039 |
| Capped/Annealed | 0.42 | 0.35 |
| Uncapped/Annealed | 0.54 | 0.63 |

Figure 7A:
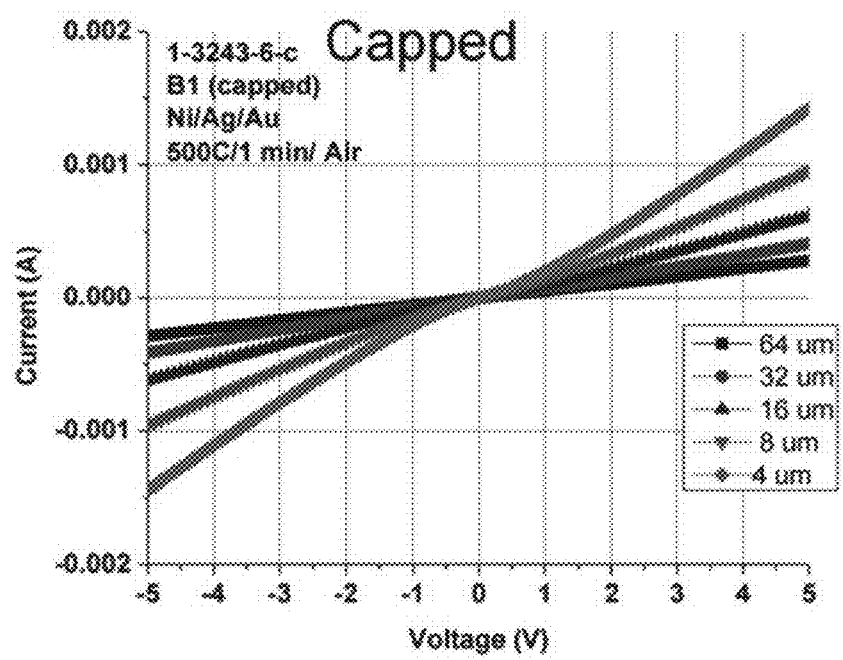
FIGS. 7A-B show TLM curves of the capped (FIG. 7A) and uncapped (FIG. 7B) portions of the 1220° C. annealed sample. The capped portion of the sample exhibits ohmic behavior while the uncapped portion does not with higher drive currents for the same voltages/spacing. (Legend lists the plots from top to bottom on the left side.)
Figure 7B:
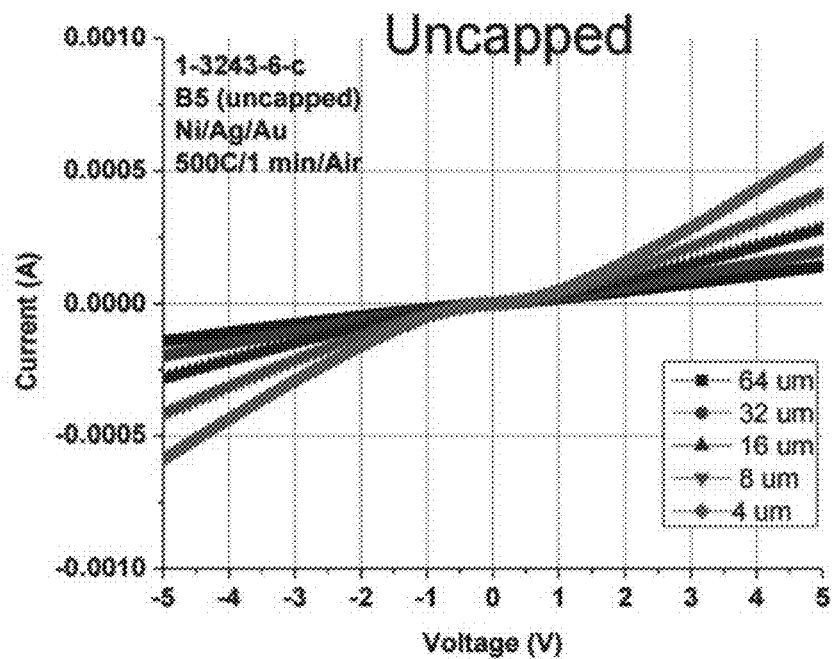

This difference in surface roughness between the capped and uncapped portions of the samples translates into a difference in electrical characteristics. Transmission Line Measurements (TLM) were performed on the annealed samples by first depositing a p-metal stack consisting of Ni/Ag/Au. After deposition, the contacts were annealed at 500° C. for 60 s in air. TLM measurements were then taken and compared between the capped and uncapped portions of the samples as shown in Table 2. The TLM curves are shown for the 1220° C. annealed sample in FIGS. 7A-B. Consistently on both samples studied, the uncapped portion of the sample resulted in a higher $R_s$. The uncapped portion of the 900° C. annealed sample exhibited a 61.7% increase in $R_s$ while the 1220° C. annealed sample had a 70.1% increase in $R_s$ for the uncapped portion of the annealed sample compared to the unannealed portion. Additionally, the uncapped portions of the samples exhibited non-ohmic behavior. This non-ohmic behavior is consistent with the decomposition of the semiconductor at the surface.

TABLE 2

TLM data from the capped and uncapped portions

| Temperature | Capping | $R_s$ (kΩ/sqr) | $L_t$ (μm) | $R_{c,sp}$ (Ω-cm$^2$) |
|---|---|---|---|---|
| 900° C. | NbN capped | 21.4 | 1.5 | $3.20 \times 10^{-3}$ |
| 900° C. | Uncapped | 34.6 | | $1.1 \times 10^{-3}$ (non-ohmic) |
| 1220° C. | NbN capped | 26.8 | 1.6 | $4.20 \times 10^{-4}$ |
| 1220° C. | Uncapped | 45.6 | | $1.2 \times 10^{-3}$ (non-ohmic) |

Figure 8:
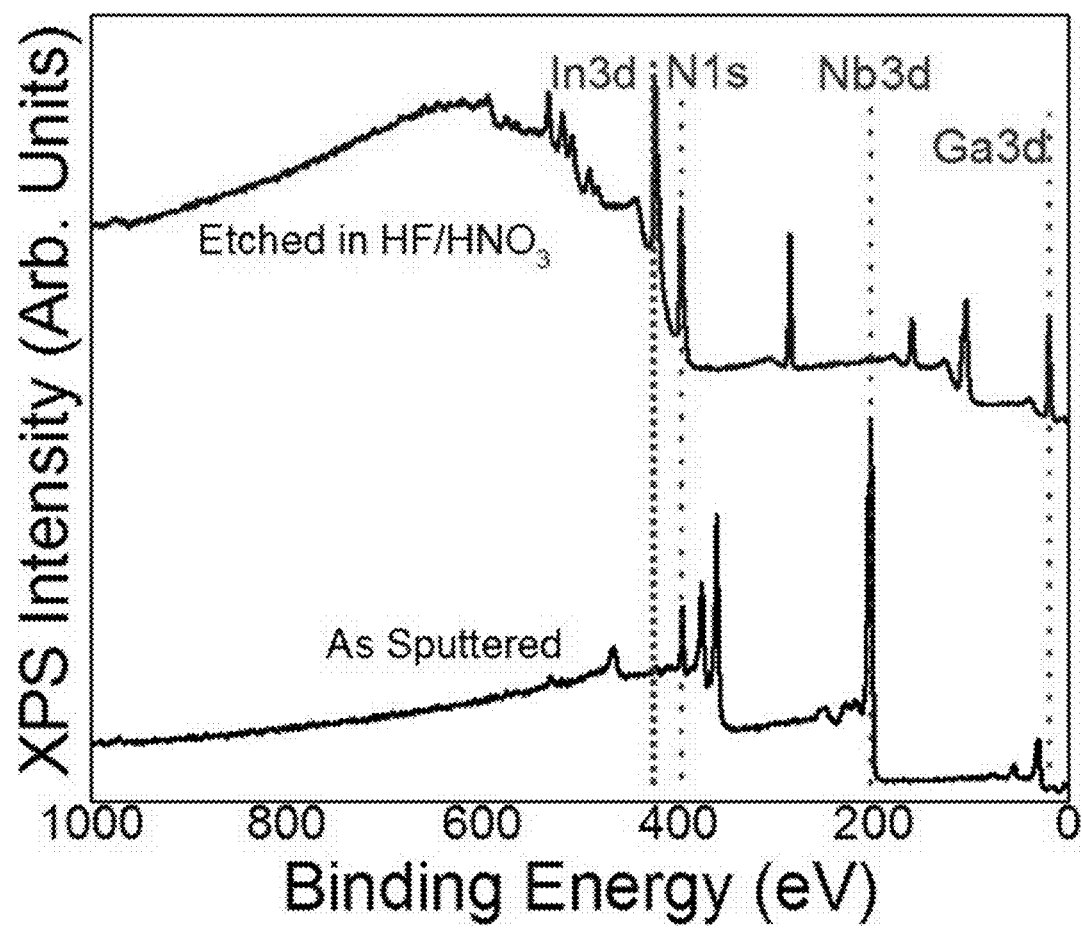
FIG. 8 shows XPS spectra of a NbN-capped sample after sputtering and after etching in HF/HNO$_3$. The etchant is successful at completely removing the NbN capping layer.

Finally, to demonstrate that the NbN capping layer is easily removed using a wet process, XPS spectra were recorded before and after submerging the NbN-capped InGaN samples in a 1:1 HF:HNO$_3$ solution for 60 s. Before submerging the NbN sample, the Nb 3d peak is the most intense peak in the XPS survey spectrum as shown in FIG. 8. After wet processing the capped sample, the Nb peak is no longer observable, indicating that the NbN is completely removed using wet processing.

In summary, a capping material, NbN, was introduced as a high temperature capable cap that is easily removable using wet processing. It was demonstrated that NbN is capable of avoiding decomposition when used on an InGaN layer that is subjected to annealing temperatures up to 1220° C. Finally, it was shown that the NbN capping layer can be completely removed using a HF/HNO$_3$ wet process.

Obviously, many modifications and variations are possible in light of the above teachings. It is therefore to be understood that the claimed subject matter may be practiced otherwise than as specifically described. Any reference to claim elements in the singular, e.g., using the articles "a", "an", "the", or "said" is not construed as limiting the element to the singular.

What is claimed is:

1. A method comprising:
   providing a substrate having a surface comprising a III-nitride, sapphire, silicon, diamond, gallium arsenide, or silicon carbide;
   depositing a layer of a transition metal nitride directly on the surface; and
   annealing the substrate at at least 900° C. in an oxygen-free environment.

2. The method of claim 1, wherein the substrate is a bulk III-nitride substrate.

3. The method of claim 1;
   wherein the substrate has a second surface comprising a second III-nitride, sapphire, silicon, or silicon carbide; and
   wherein the method further comprises:
   depositing a second layer of a second transition metal nitride directly on the second surface.

4. The method of claim 1, wherein the surface comprises InGaN, GaN, or AlGaN.

5. The method of claim 1, wherein the surface comprises InN, AlN, InAlN, or InAlGaN.

6. The method of claim 1, wherein the surface comprises an impurity.

7. The method of claim 1, wherein the transition metal nitride is NbN.

8. The method of claim 1, wherein the transition metal nitride is TiN, TaN, ZrN, HfN, VN, or V$_2$N.

9. The method of claim 1, wherein the annealing is at a temperature greater than the decomposition temperature of the surface at atmospheric pressure.

10. The method of claim 1, wherein the depositing is by atomic layer deposition, metal organic chemical vapor deposition, molecular beam epitaxy, or physical vapor deposition.

11. The method of claim 1, further comprising:
    depositing a layer of AlN or silicon nitride on the transition metal nitride before annealing.

12. The method of claim 11, further comprising:
    etching the AlN after annealing.

13. The method of claim 1, further comprising:
    etching the transition metal nitride with an etchant.

14. The method of claim 13, wherein the etchant does not etch the surface.

15. The method of claim 13, wherein the etchant is HF or HF/HNO$_3$.

16. An article comprising:
    a substrate having a surface comprising a III-nitride, sapphire, silicon, diamond, gallium arsenide, or silicon carbide;
    a layer of a transition metal nitride directly on the surface;
    a 10-1000 nm thick layer of AlN or silicon nitride on the transition metal nitride.

17. The article of claim 16, wherein the substrate is a bulk III-nitride substrate.

18. The article of claim 16;
    wherein the substrate has a second surface comprising a second III-nitride, sapphire, silicon, or silicon carbide; and
    wherein the article further comprises:
    a second layer of a second transition metal nitride directly on the second surface.

19. The article of claim 16, wherein the surface comprises InGaN, GaN, or AlGaN.

20. The article of claim 16, wherein the surface comprises InN, AlN, InAlN, or InAlGaN.

21. The article of claim 16, wherein the surface comprises an impurity.

22. The article of claim 16, wherein the surface exhibits p-type conductivity.

23. The article of claim 16, wherein the transition metal nitride is NbN.

24. The article of claim 16, wherein the transition metal nitride is TiN, TaN, ZrN, HfN, VN, or V$_2$N.

\* \* \* \* \*